(12) United States Patent
Chen et al.

(10) Patent No.: US 11,893,284 B2
(45) Date of Patent: Feb. 6, 2024

(54) METHOD, DEVICE AND SYSTEM FOR TESTING MEMORY DEVICES (71) Applicant: CHANGXIN MEMORY TECHNOLOGIES, INC., Hefei (CN)

(72) Inventors: Xinwang Chen, Hefei (CN); Maosong Ma, Hefei (CN); Jianbin Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 279 days.

(21) Appl. No.: 17/452,857

(22) Filed: Oct. 29, 2021

(65) Prior Publication Data
US 2023/0015543 A1 Jan. 19, 2023

Related U.S. Application Data
(63) Continuation of application No. PCT/CN2021/108901, filed on Jul. 23, 2021.

(30) Foreign Application Priority Data
Jul. 19, 2021 (CN) .......................... 202110812751.3

(51) Int. Cl.
*G06F 3/06* (2006.01)
*G11C 29/08* (2006.01)

(52) U.S. Cl.
CPC ............ *G06F 3/0679* (2013.01); *G11C 29/08* (2013.01)

(58) Field of Classification Search
CPC ............................. G11C 29/08; G06F 3/0679
See application file for complete search history.

(56) References Cited

U.S. PATENT DOCUMENTS

| 6,445,205 | B1 * | 9/2002 | Fremrot | G06F 11/221 |
| | | | | 324/762.02 |
| 7,171,598 | B2 * | 1/2007 | Cullen | G11C 29/56004 |
| | | | | 714/724 |
| 7,509,629 | B2 * | 3/2009 | Sakamoto | G06F 30/33 |
| | | | | 717/124 |
| 7,631,238 | B2 | 12/2009 | Jung | |
| 8,000,954 | B2 * | 8/2011 | Schalick | G01R 31/31704 |
| | | | | 703/23 |

(Continued)

FOREIGN PATENT DOCUMENTS

| CN | 101118788 A | 2/2008 |
| CN | 102890648 A | 1/2013 |

(Continued)

OTHER PUBLICATIONS

International Search Report cited in PCT/CN2021/108901, dated Mar. 1, 2022, 10 pages.

*Primary Examiner* — Guy J Lamarre
(74) *Attorney, Agent, or Firm* — Cooper Legal Group, LLC (57) ABSTRACT

The present disclosure provides a method, device and system for testing memory devices. The testing method includes: receiving a test instruction, the test instruction being used to characterize a model of a memory device to be tested that is connected to a test platform; selecting, according to the test instruction, a testing method corresponding to the model of the memory device to be tested from a plurality of pre-stored testing methods as a target testing method; and executing the target testing method to test the memory device to be tested.

14 Claims, 4 Drawing Sheets

(56) References Cited

U.S. PATENT DOCUMENTS

| | | | |
|---|---|---|---|
| 8,533,531 B2* | 9/2013 | El Mahdy | G06F 11/261 |
| | | | 714/28 |
| 10,484,045 B2* | 11/2019 | Trojer | H04B 3/46 |
| 11,728,001 B2* | 8/2023 | Geiger | G01R 31/317 |
| | | | 365/201 |
| 2004/0035939 A1* | 2/2004 | Lin | G06K 7/0021 |
| | | | 235/487 |
| 2004/0260993 A1* | 12/2004 | Griffin | G06F 11/3433 |
| | | | 714/E11.193 |
| 2006/0265636 A1* | 11/2006 | Hummler | G06F 11/1008 |
| | | | 365/201 |
| 2021/0191832 A1* | 6/2021 | Hamor | G11C 29/50 |
| 2022/0128622 A1* | 4/2022 | Pei | G01R 31/2867 |
| 2022/0230700 A1* | 7/2022 | Hamor | G06F 9/5016 |

FOREIGN PATENT DOCUMENTS

| | | |
|---|---|---|
| CN | 108519938 A | 9/2018 |
| CN | 109346121 A | 2/2019 |
| CN | 112164417 A | 1/2021 |
| CN | 213583124 U | 6/2021 |
| KR | 20080043616 A | 5/2008 |

* cited by examiner

METHOD, DEVICE AND SYSTEM FOR TESTING MEMORY DEVICES

CROSS-REFERENCE TO RELATED APPLICATIONS

This is a continuation of International Application No. PCT/CN2021/108901, filed on Jul. 28, 2021, which claims the priority to Chinese Patent Application 202110812751.3, titled "METHOD, DEVICE AND SYSTEM FOR TESTING MEMORY DEVICES" and filed on Jul. 19, 2021. The entire contents of International Application No. PCT/CN2021/108901 and Chinese Patent Application 202110812751.3 are incorporated herein by reference.

TECHNICAL FIELD

The present disclosure relates to, but is not limited to, a method, device and system for testing memory devices.

BACKGROUND

DDR (Double Data Rate) synchronous dynamic random access memory chips are increasingly diverse with the development of science and technology, and different types of DDR chips have different test requirements. During the design and production of DDR chips, test platforms are required to test the functions and performance of the DDR chips to be tested. However, in the prior art, one testing device can test only one DDR chip. In order to meet the requirements for testing different types of DDR chips, different testing devices are required, so the chip test efficiency is relatively low and the versatility is poor.

SUMMARY

The subject matter is described in detail herein below, which is not intended to limit the scope of protection of claims.

The present disclosure provides a method, device and system for testing memory devices.

The first aspect of the present disclosure provides a method for testing memory devices, the testing method including:

receiving a test instruction, the test instruction being used to characterize a model of a memory device to be tested that is connected to a test platform;

selecting, according to the test instruction, a testing method corresponding to the model of the memory device to be tested from a plurality of pre-stored testing methods as a target testing method; and executing the target testing method to test the memory device to be tested.

The second aspect of the present disclosure provides a device for testing memory devices, the testing device including:

one or more processors; and a storage apparatus, configured to store one or more programs, wherein the one or more programs, when executed by the one or more processors, cause the one or more processors to execute operations of:

receiving a test instruction, the test instruction being used to characterize a model of a memory device to be tested that is connected to a test platform;

selecting, according to the test instruction, a testing method corresponding to the model of the memory device to be tested from a plurality of pre-stored testing methods as a target testing method; and executing the target testing method to test the memory device to be tested.

The third aspect of the present disclosure provides a system for testing memory devices, the testing system including a test platform, at least two test seats being arranged on the test platform, the test seats being used for installing of memory devices to be tested, and the testing system further including the device for testing memory devices as described in the second aspect, and adopting the method for testing memory devices as described in the first aspect for testing.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without any creative efforts.

DETAILED DESCRIPTION

A clear and complete description will be made to the technical solutions in the embodiments of the present disclosure below in combination with the drawings in the embodiments of the present disclosure. Apparently, the embodiments described are part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

DDR memories (the full name of DDR memory is DDR SDRAM (Double Data Rate SDRAM (synchronous dynamic random-access memory)), that is, double data rate synchronous dynamic random-access memory) are the most widely used memory devices, and include at least DDR1, DDR2, DDR3 and DDR4 series according to the models of SDRAM chips. Existing methods for testing memory devices test DDR memories by using ATE (Automatic Test Equipment) and SLT (System Level Test). Due to the diversity of DDR chips and the incompatibility of test card slots, a different test equipment is required to test a specific chip, which requires relatively high investment in manpower and material resources, not only increases the test cost, but also greatly limits the test efficiency of the chip.

The present disclosure provides a method for testing memory devices. In the method for testing memory devices, multiple different models of memory devices to be tested can be installed on the same test platform at the same time, and target testing methods corresponding to the memory devices to be tested are selected from different testing methods to test the memory devices to be tested, so that the multiple memory devices can be tested without changing the testing device, which not only reduces the investment in manpower and material resources, reduces the test cost, but also improves the test efficiency. Moreover, the memory device to be tested can be independently connected to the test platform for testing, so compared to the existing situation that the program of a CPU main board runs in the memory of the memory device to be tested, the memory space of the memory device to be tested will not be occupied in the present disclosure, and the entire address space of the memory device to be tested can be tested, to obtain more comprehensive and reliable test results.

A method, device and system for testing memory devices proposed in the present disclosure will be further described in detail below with reference to the accompanying drawings and specific embodiments.

Figure 1:
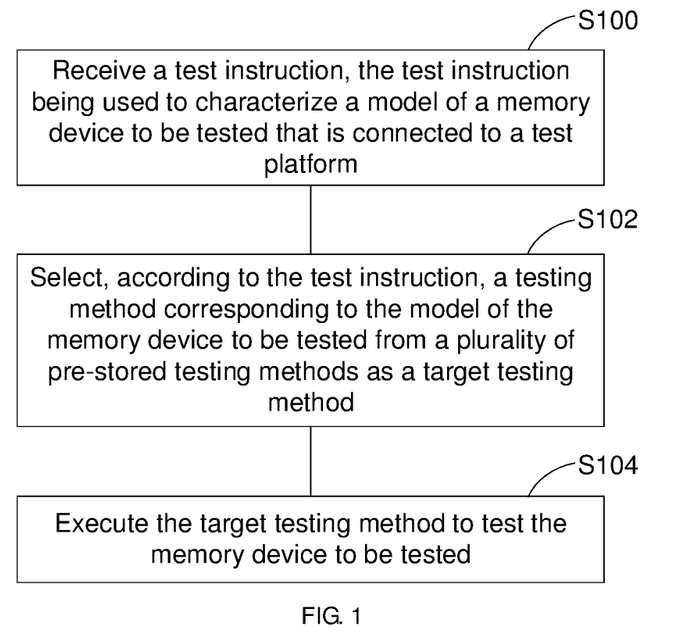
FIG. 1 is a flowchart of a method for testing memory devices according to an exemplary embodiment.

An exemplary embodiment of the present disclosure provides a method for testing memory devices. FIG. 1 shows a flowchart of a method for testing memory devices according to an exemplary embodiment of the present disclosure.

Referring to FIG. 1, the testing method includes:

Step S100, receiving a test instruction, the test instruction being used to characterize a model of a memory device to be tested that is connected to a test platform;

Step S102, selecting, according to the test instruction, a testing method corresponding to the model of the memory device to be tested from a plurality of pre-stored testing methods as a target testing method; and Step S104, executing the target testing method to test the memory device to be tested.

In step S100, test connection devices for connecting different models of memory devices, such as a plurality of test seats, may be arranged on the test platform. A plurality of different models of memory devices and the plurality of test seats are installed in one-to-one correspondence in advance, that is, the different models of memory devices are installed on one test platform at the same time for testing. For example, x4, x8, and x16 DDR4 chips may be connected to the test platform in advance, and then the user inputs test instructions for the memory devices to be tested on the test platform. The user may specify the models of the memory devices to be tested to generate the test instructions, then the test instructions include identification information of the models of the memory devices to be tested. For example, the user inputs a test instruction for a x4 DDR4 chip on the test platform through an input device (such as a terminal device), then the test instruction includes identification information of the x4 DDR4 chip. The user may also trigger the test instruction for any memory device that has been connected to the test platform, the test instruction carrying the model of the memory device.

In this embodiment, the test instruction may further include a related test task for the memory device to be tested, such as performance test indicator information or memory performance indicator information, which is not specifically limited here.

In this embodiment, the test platform may use a FPGA (Field Programmable Gate Array) chip as a processor, which has the advantages of strong computing power, flexibility, low cost, etc., thereby further reducing the test cost.

In step S102, a test program may be pre-loaded through the test platform such as the FPGA chip, the test program including testing methods that can test multiple models of memory devices. After the test instruction for the memory device to be tested is received, the user-specified memory device to be tested is determined, according to the model of the memory device to be tested in the test instruction, from the plurality of memory devices connected to the test platform, and then the testing method corresponding to the model of the memory device to be tested is selected, according to the model of the memory device to be tested, from the testing methods pre-stored in the test platform, as a target testing method for testing the memory device to be tested. For example, when receiving a test instruction for an x4 DDR4 chip, the test platform may pre-load a test program including the testing method for the x4 DDR4 chip, and select the testing method corresponding to the x4 DDR4 chip from the testing methods pre-stored in the test program as a target testing method.

In this embodiment, the target testing method may include one or more test algorithms corresponding to the test task of the memory device to be tested, such as Solid bits test algorithm and March C test algorithm. Test programs, test methods and test algorithms all can be described in RTL (Register Transfer Level) level language. RTL level description refers to describe, on a register level, a data flow mode how data is transferred, controlled and processed between registers. For example, Verilog HDL hardware description language is equivalent to testing the memory device to be tested through hardware. Therefore, a lot of time for occupying CPU for operations such as function call and accessing other peripherals in the existing testing methods written in C language is saved, the running speed is fast, and the bandwidth utilization for testing the memory device is high.

In this embodiment, signals of other test algorithms that are not selected will be suspended. The signal suspension indicates that neither a high level nor a low level is connected. That is, when the memory device to be tested is tested, the test algorithms that are not selected will not be executed. Therefore, valid test algorithms are run to test the memory device to be tested, the test time for running invalid test algorithms is reduced, and the test efficiency is improved.

In step S104, the memory device to be tested can be independently connected to the test platform, and the target testing method is executed after the test platform is controlled to independently load a plurality of pre-stored testing methods and schedules the target testing method from the testing methods, that is, the test algorithms included in the target testing method are executed to comprehensively test the address space of the memory device to be tested, so compared to the existing testing method in which the program of the CPU main board runs in the memory device such as in the memory of the DDR4 chip, the testing method in this embodiment does not occupy the original memory space of the memory device, and can thus comprehensively test the entire address space of the memory device.

In this embodiment, a plurality of memory devices of different models are independently connected to the test platform, the test platform is controlled to independently load a plurality of pre-stored testing methods and determine the target testing method from the testing methods, and then the target testing method is executed to comprehensively test the address space of the memory device to be tested. On the one hand, multiple different models of memory devices to be tested are connected to one test platform for testing, which improves the universality of the testing device; and on the other hand, the method for testing memory devices does not occupy the memory space of the memory device to be tested, and can thus cover the entire address space of the memory device to be tested for testing, so the test results are more comprehensive and the reliability is higher.

Figure 2:
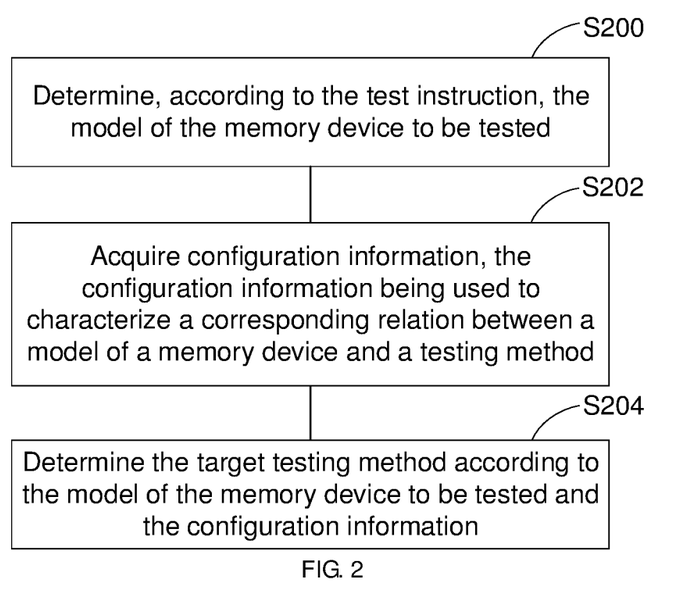
FIG. 2 is a flowchart of step S102 in the method for testing memory devices according to an exemplary embodiment.

In this embodiment, referring to FIG. 2, step S102 of selecting, according to the test instruction, a testing method corresponding to the model of the memory device to be tested from a plurality of pre-stored testing methods as a target testing method may include: Step S200, determining, according to the test instruction, the model of the memory device to be tested;

Step S202, acquiring configuration information, the configuration information being used to characterize a corresponding relation between a model of a memory device and a testing method; and Step S204, determining the target testing method according to the model of the memory device to be tested and the configuration information.

In step S200 of this embodiment, when the test instruction inputted by the user for the specified memory device to be tested, the test instruction may be analyzed to obtain related information such as the model of the memory device to be tested and the test task, for example, the test instruction is analyzed to obtain the model of the x4 DDR4 chip, and the test task for testing the x4 DDR4 chip can also be determined, so that the memory device to be tested is determined from the multiple models of memory devices connected to the test platform, and the memory device to be tested is tested according to the test task.

In step S202, the test program can be pre-loaded by controlling the test platform, and the test program includes a plurality of testing methods that can test multiple models of memory devices, so corresponding relations between the models of the memory devices and the testing methods can be stored in the configuration information of the test program. For example, the corresponding relations with the testing methods corresponding to the x4 DDR4 chip, the x8 DDR4 chip, and the x16 DDR4 chip may be respectively stored in the configuration information. After the model of the memory device to be tested, such as the x4 DDR4 chip, is determined according to the test instruction, the configuration information may be acquired, and the testing method corresponding to the x4 DDR4 chip is searched from the configuration information according to the model (x4) of the memory device to be tested (DDR4 chip).

In step S204, the target testing method that can test the memory device to be tested is determined according to the corresponding relation between the model of the memory device to be tested and the testing method stored in the configuration information, so as to execute the target testing method for testing the memory device to be tested.

Figure 3:
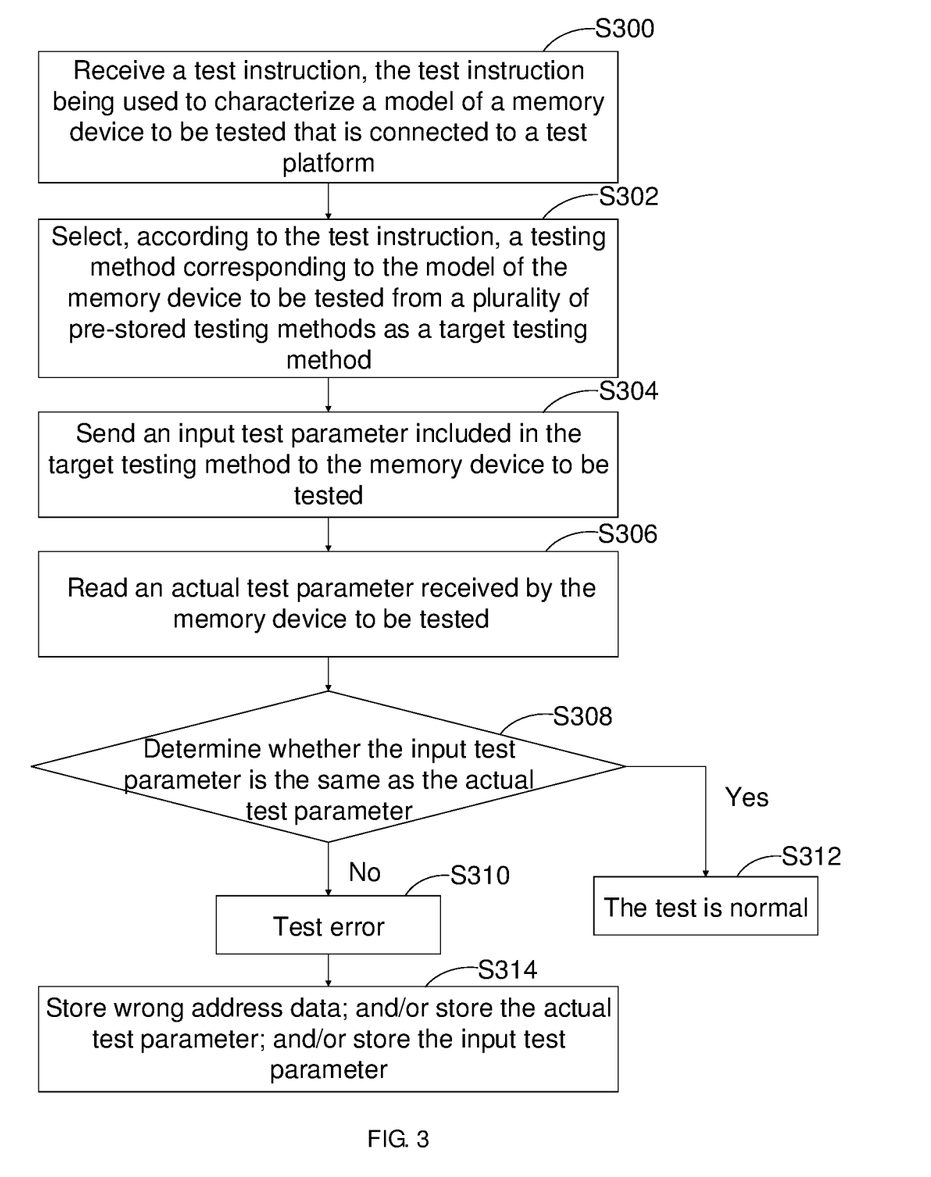
FIG. 3 is a flowchart of a method for testing memory devices according to an exemplary embodiment.

Referring to FIG. 3, in some exemplary embodiments, a method for testing memory devices is provided. The testing method includes:

Step S300, receiving a test instruction, the test instruction being used to characterize a model of a memory device to be tested that is connected to a test platform;

Step S302, selecting, according to the test instruction, a testing method corresponding to the model of the memory device to be tested from a plurality of pre-stored testing methods as a target testing method;

Step S304, sending an input test parameter included in the target testing method to the memory device to be tested;

Step S306, reading an actual test parameter received by the memory device to be tested;

Step S308, determining whether the input test parameter is the same as the actual test parameter;

Step S310, when the input test parameter is different from the actual test parameter, determining that there is a test error; otherwise, skipping to step S312;

Step S312, when the input test parameter is the same as the actual test parameter, determining that there is no test error, that is, the test is normal.

In this embodiment, the implementations of step S300 and step S302 are the same as those of step S100 and step S102 in the foregoing embodiment, and details are not described herein again.

In step S304, after the target testing method for testing the memory device to be tested is determined, the target testing method is sent to the memory device to be tested. Because the target testing method may include a plurality of test algorithms for the memory device to be tested, and the test parameter of each test algorithm may be different, test parameter information of each test algorithm needs to be inputted to the memory device to be tested according to relevant rules of the test algorithms, to test the memory device to be tested.

In some exemplary embodiments, for example, the target testing method includes a Solid bits test algorithm and a March C test algorithm, the input test parameter of the March C test algorithm included in the target testing method may be sent to a memory controller by a multiplexer, the memory controller sends the input test parameter of the March C test algorithm to the memory device to be tested, and the March C test algorithm is executed in the memory device to be tested for testing. After the March C test algorithm is executed, the input test parameter of the Solid bits test algorithm may be sent to the memory controller by the multiplexer, the memory controller sends the input test parameter of the Solid bits test algorithm to the memory device to be tested, and the Solid bits test algorithm is executed in the memory device to be tested for testing. Therefore, a plurality of test algorithms in the target testing method are sequentially executed in the memory device to be tested to complete the test.

In this embodiment, the input test parameter includes an input control signal and an input data signal, the input control signal may include an input rule corresponding to the test algorithm in the target testing method, and the input data signal may include test parameter information corresponding to the test algorithm in the target testing method.

In step S306, after the memory device to be tested receives the target testing method, that is, the memory device to be tested receives the test algorithm corresponding to the test task, a test parameter is written to the memory device to be tested to run the test algorithm, for example, a read/write test may be performed on the address space of the memory device to be tested according to the test algorithm, a write operation is performed on the memory device to be tested according to the input rule of the test algorithm and the test parameter, and then a read operation is performed on the address space, to which the test parameter has been inputted, of the memory device to be tested, to read the actual test parameter received in the address space, so as to compare the test parameter inputted from the address space with the read actual test parameter.

In step S308, after the actual test parameter in the address space, to which the test parameter has been written, of the memory device to be tested is read, whether the input test parameter is the same as the read actual test parameter is determined, and then whether a test error occurs in the address space of the memory device to be tested is determined according to the determination result.

In step S310, after the input test parameter is compared with the read actual test parameter, if it is determined that the input test parameter is different from the read actual test parameter, it is determined that there is a test error in the address space of the memory device to be tested.

In step S312, if it is determined that the input test parameter is the same as the read actual test parameter, it is determined that there is no test error in the address space of the memory device to be tested.

In this embodiment, if there is a test error, the testing method further includes:

Step S314, storing wrong address data; and/or storing the actual test parameter; and/or storing the input test parameter.

In this step, when a test error occurs in the memory device to be tested, in order to be able to analyze the test result to determine the address space where the error occurs in the memory device to be tested, related error information about the test error of the memory device to be tested needs to be stored according to the analysis, for example, storing wrong address data of the memory device to be tested, or the input test parameter written to the memory device to be tested, or the actual test parameter read from the memory device to be tested, or storing the wrong address data, the input test parameter and the actual test parameter respectively, which is not specifically limited here. The wrong address data, the actual test parameter and the input test parameter may be respectively stored in data storage units or data storage modules that can store data, for example, the wrong address data is stored in a wrong address storage module, the input test parameter is stored in an input test parameter storage module, and the actual test parameter is stored in an actual test parameter storage module.

In this embodiment, related error information about the test error of the memory device to be tested may be respectively stored in FIFO (First Input First Output) storage modules, a physical address of the memory device to be tested when the test error occurs is stored in a wrong address FIFO storage module, test parameter data written to the memory device to be tested when the test error occurs is stored in an input test parameter FIFO storage module, and actual test parameter data read from the memory device to be tested when the test error occurs is stored in an actual data FIFO storage module. The related error information about the test error of the memory device to be tested may also be outputted and displayed by a terminal device, so as to determine the problem of the memory device to be tested according to the outputted and displayed test result.

In this embodiment, the wrong address data includes a physical address of the address space of the memory device to be tested where the test error occurs. By directly storing the physical address of the memory device to be tested where the test error occurs, a technician can directly analyze the physical address of the memory device to be tested when the test error occurs, which improves the analysis efficiency of the test result.

Figure 4:
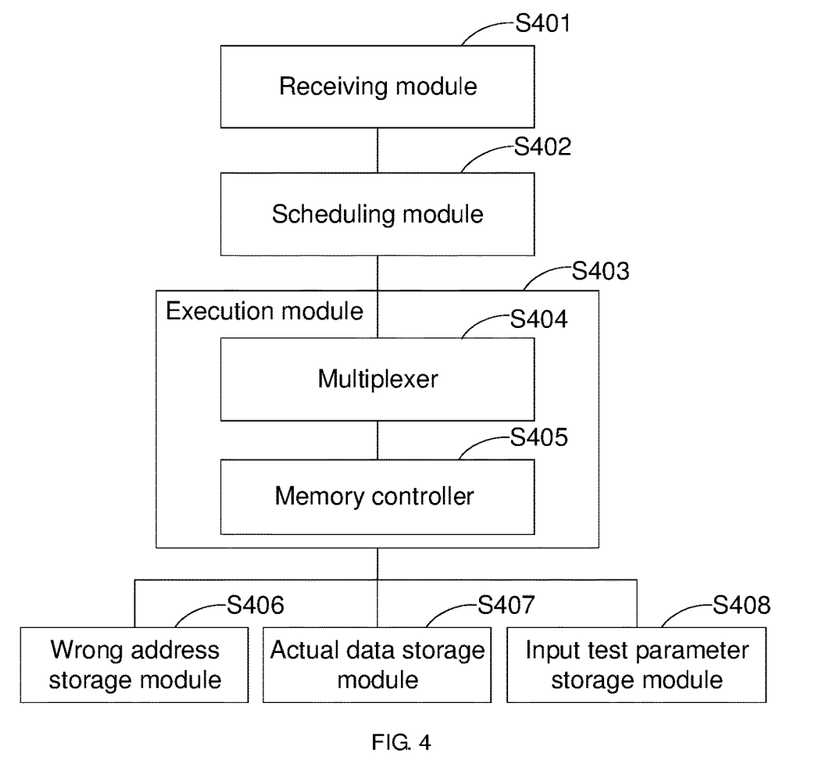
FIG. 4 is a block diagram of a device for testing memory devices according to an exemplary embodiment.

FIG. 4 shows a block diagram of a device for testing memory devices according to an exemplary embodiment. As shown in FIG. 4, the testing device at least includes a receiving module 401, a scheduling module 402, and an execution module 403.

The receiving module 401 is configured to receive a test instruction, the test instruction being used to characterize a model of a memory device to be tested that is connected to a test platform;

The scheduling module 402 is configured to select, according to the test instruction, a testing method corresponding to the model of the memory device to be tested from a plurality of pre-stored testing methods as a target testing method;

The execution module 403 is configured to execute the target testing method to test the memory device to be tested.

In this embodiment, the scheduling module 402 is configured to: determine, according to the test instruction, the model of the memory device to be tested;

acquire configuration information, the configuration information being used to characterize a corresponding relation between a model of a memory device and a testing method; and determine the target testing method according to the model of the memory device to be tested and the configuration information.

In this embodiment, the testing device further includes:
a multiplexer 404, configured to send an input test parameter included in the target testing method to a memory controller; and the memory controller 405, configured to send the input test parameter included in the target testing method to the memory device to be tested;

the memory controller 405 being further configured to read an actual test parameter received by the memory device to be tested; and the memory controller 405 being further configured to determine that there is a test error when the input test parameter is different from the actual test parameter.

In this embodiment, the testing device further includes:
a wrong address storage module 406, configured to store wrong address data; and/or, an actual data storage module 407, configured to store actual test data; and/or, an input test parameter storage module 408, configured to store the input test parameter.

Figure 5:
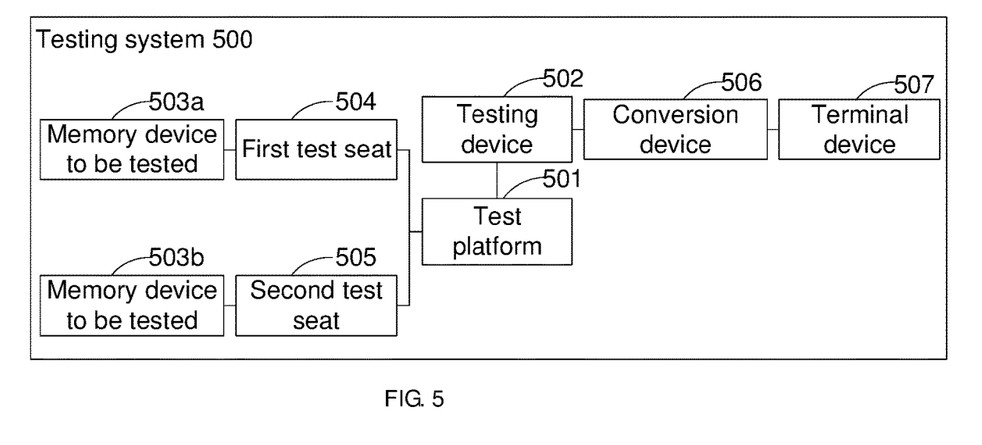
FIG. 5 is a schematic diagram of a system for testing memory devices according to an exemplary embodiment.

FIG. 5 shows a schematic diagram of a system for testing memory devices according to an exemplary embodiment. As shown in FIG. 5, the testing system 500 includes a test platform 501, at least two test seats, a testing device 502, and memory devices to be tested. The test platform 501 is electrically connected to the at least two test seats, and the testing device 502 is electrically connected to the test platform 501. The testing system uses the above-mentioned method for testing memory devices to test the memory devices to be tested.

In this embodiment, exemplarily, the test platform 501 is electrically connected to two test seats, the two test seats are used for installing of the memory devices to be tested, the two test seats are respectively a first test seat 504 and a second test seat 505, the first test seat 504 may be used for installing of a 78ball DDR4 chip, and the second test seat 505 may be used for installing of a 96ball DDR4 chip. As shown in FIG. 5, for convenience, the memory devices to be tested 503 include a memory device to be tested 503a and a memory device to be tested 503b, the 78 ball DDR4 chip includes a x4 DDR4 chip and a x8 DDR4 chip, the 96 ball DDR4 chip includes a x16 DDR4 chip, the x4 DDR4 chip and the x8 DDR4 chip are represented by the memory device to be tested 503a, the x16 DDR4 chip is represented by the memory device to be tested 503b, then the memory device to be tested 503a is electrically connected to the test platform 501 through the first test seat 504, and the memory device to be tested 503b is electrically connected to the test platform 501 through the second test seat 505. Therefore, the x4 DDR4 chip, the x8 DDR4 chip and the x16 DDR4 chip can be respectively installed on the test platform 501 at the same time through the first test seat 504 and the second test seat 505 for testing, which solves the problem of changing the testing device for testing different models of memory devices to be tested, and improves the versatility of the testing device.

In this embodiment, referring to FIG. 5, the testing system 500 may output test results and error information through a serial port. For example, the testing device 502 may be connected to a display device through the serial port to display the test results. For ease of use, the testing system 500 further includes a conversion device 506 electrically connected to the testing device 502, the serial port may be converted into a universal serial bus (USB) interface by the conversion device 506, and then the USB interface is connected to the display device to display the test results, so that the technician can analyze the test results. Exemplarily, the USB interface may be a Type-C interface.

In this embodiment, referring to FIG. 5, the testing system 500 further includes a terminal device 507, the terminal device 507 is electrically connected to the testing device 502 through the conversion device, the terminal device 507 is configured for a user to input test instructions, and the terminal device 507 may also be used as a display device to display the test results, for example, the data in the wrong address FIFO storage module, the input test parameter FIFO storage module and the actual data FIFO storage module is read through the serial port and displayed on the terminal device 507.

Figure 6:
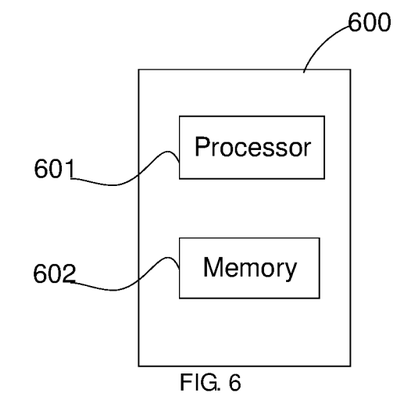
FIG. 6 is a block diagram of a device for testing memory devices according to an exemplary embodiment.

An exemplary embodiment of the present disclosure provides a device for testing memory devices. Referring to FIG. 6, the device for testing memory devices 600 may be provided as a terminal device. The device for testing memory devices 600 may include a processor 601, and one or more processors may be set as required. The device for testing memory devices 600 may further include a memory 602 configured to store an executable instruction, such as an application program, of the processor 601. One or more memories may be set as required. The memory may store one or more application programs. The processor 601 is configured to execute the instruction to perform the foregoing method.

Persons skilled in the art should understand that the embodiments of the present disclosure may be provided as a method, an apparatus (device), or a computer program product. Therefore, the present disclosure may use a form of hardware only examples, software only examples, or examples with a combination of software and hardware. Moreover, the present disclosure may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a RAM, a ROM, an EEPROM, a flash memory or other storage technologies, a CD-ROM, a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons of ordinary skill in the art, the communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including instructions is provided. Referring to FIG. 6, for example, the non-transitory computer-readable storage medium may be the memory 602 including instructions. The foregoing instructions may be executed by the processor 601 of the device for testing memory devices 600 to complete the foregoing method. For example, the non-transitory computer-readable storage medium may be a ROM, a RAM, a CD-ROM, a magnetic tape, a floppy disk, an optical data storage device, or the like.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

The embodiments or implementations in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some implementations", "schematic implementation", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

In the method, device and system for testing memory devices provided by the embodiments of the present disclosure, multiple different models of memory devices to be tested can be installed on the test platform at the same time, and the memory devices to be tested can be tested respectively by changing different testing methods and selecting target testing methods corresponding to the models of the memory devices to be tested. On the one hand, multiple different models of memory devices to be tested are connected to one test platform and tested, which improves the test efficiency; and on the other hand, the method for testing memory devices does not occupy the memory space of the memory device to be tested, and can thus cover the entire address space of the memory device to be tested, so the test results are more comprehensive and the reliability is higher.

The invention claimed is:

1. A method for testing memory devices, the method comprising:
   receiving a test instruction, the test instruction being used to characterize a model of a memory device to be tested that is connected to a test platform;
   selecting, according to the test instruction, a testing method corresponding to the model of the memory device to be tested from a plurality of pre-stored testing methods as a target testing method; and
   executing the target testing method to test the memory device to be tested.

2. The method for testing memory devices according to claim 1, wherein the selecting, according to the test instruction, a testing method corresponding to the model of the memory device to be tested from a plurality of pre-stored testing methods as a target testing method comprises:
   determining, according to the test instruction, the model of the memory device to be tested;
   acquiring configuration information, the configuration information being used to characterize a corresponding relation between a model of a memory device and a testing method; and
   determining the target testing method according to the model of the memory device to be tested and the configuration information.

3. The method for testing memory devices according to claim 1, wherein the executing the target testing method to test the memory device to be tested comprises:
   sending an input test parameter included in the target testing method to the memory device to be tested;
   reading an actual test parameter received by the memory device to be tested; and
   when the input test parameter is different from the actual test parameter, determining that there is a test error.

4. The method for testing memory devices according to claim 3, when there is the test error, the testing method further comprises at least one of:
   storing wrong address data;
   storing the actual test parameter; or
   storing the input test parameter.

5. The method for testing memory devices according to claim 3, wherein the input test parameter comprises an input control signal and an input data signal.

6. A device for testing memory devices, the device comprising:
   one or more processors; and
   a storage apparatus, configured to store one or more programs, wherein the one or more programs, when executed by the one or more processors, cause the one or more processors to execute operations of:
      receiving a test instruction, the test instruction being used to characterize a model of a memory device to be tested that is connected to a test platform;
      selecting, according to the test instruction, a testing method corresponding to the model of the memory device to be tested from a plurality of pre-stored testing methods as a target testing method; and
      executing the target testing method to test the memory device to be tested.

7. The device for testing memory devices according to claim 6, wherein the one or more programs cause the one or more processors to execute operations of:
   determining, according to the test instruction, the model of the memory device to be tested;
   acquiring configuration information, the configuration information being used to characterize a corresponding relation between a model of a memory device and a testing method; and
   determining the target testing method according to the model of the memory device to be tested and the configuration information.

8. The device for testing memory devices according to claim 7, further comprising:

a multiplexer, configured to send an input test parameter included in the target testing method to a memory controller; and the memory controller, configured to send the input test parameter included in the target testing method to the memory device to be tested;

the memory controller being further configured to read an actual test parameter received by the memory device to be tested; and the memory controller being further configured to determine that there is a test error when the input test parameter is different from the actual test parameter.

9. The device for testing memory devices according to claim 8, the one or more programs further causing the one or more processors to execute operations of at least one of:

storing wrong address data;
storing the actual test parameter; or
storing the input test parameter.

10. A system for testing memory devices, the system comprising a test platform, at least two test seats being arranged on the test platform, the at least two test seats being used for installation of memory devices to be tested, and the system further comprising a device for testing memory devices, the device comprising:

one or more processors; and a storage apparatus, configured to store one or more programs, wherein the one or more programs, when executed by the one or more processors, cause the one or more processors to execute operations of:

receiving a test instruction, the test instruction being used to characterize a model of a memory device to be tested that is connected to a test platform;

selecting, according to the test instruction, a testing method corresponding to the model of the memory device to be tested from a plurality of pre-stored testing methods as a target testing method; and executing the target testing method to test the memory device to be tested.

11. The system for testing memory devices according to claim 10, wherein the at least two test seats comprises a first test seat and a second test seat, the first test seat is used for installing of a 78ball Double Data Rate 4 (DDR4) chip, and the second test seat is used for installing of a 96ball DDR4 chip.

12. The system for testing memory devices according to claim 10, the system further comprising a conversion device, the conversion device being electrically connected to the device for testing memory devices, and the conversion device being configured to convert a serial signal of a serial port of the device for testing memory devices to a universal serial bus (USB) signal of a USB interface.

13. The system for testing memory devices according to claim 12, wherein the USB interface comprises a Type-C interface.

14. The system for testing memory devices according to claim 12, the system further comprising a terminal device, the terminal device being electrically connected to the device for testing memory devices through the conversion device, and the terminal device being configured to input test instructions.

* * * * *